United States Patent [19]

Hershberger

[11] 4,194,161
[45] Mar. 18, 1980

[54] SWITCHING MODULATORS AND DEMODULATORS UTILIZING MODIFIED SWITCHING SIGNAL

[75] Inventor: David L. Hershberger, Quincy, Ill.
[73] Assignee: Harris Corporation, Melbourne, Fla.
[21] Appl. No.: 954,365
[22] Filed: Oct. 25, 1978
[51] Int. Cl.² .................. H03C 1/06; H03D 1/04; H04H 5/00
[52] U.S. Cl. .................. 329/50; 179/1 GE; 307/240; 307/242; 329/167; 332/9 R; 332/40
[58] Field of Search ............ 329/50, 102, 104, 105, 329/167; 332/9 R, 9 T, 21, 40; 179/1 GE; 325/36; 307/240-244

[56] References Cited

U.S. PATENT DOCUMENTS

| | | | |
|---|---|---|---|
| 3,631,355 | 12/1971 | Vail | 307/242 X |
| 3,662,113 | 5/1972 | Von Recklinghausen | 179/1 GE |
| 3,902,019 | 8/1975 | Bruene | 179/1 GE |
| 3,962,551 | 6/1976 | Gay | 179/1 GE |

Primary Examiner—Siegfried H. Grimm

[57] ABSTRACT

A switching modulator (FIG. 3) for generating an FM composite stereo signal is disclosed. The modulator includes a switching circuit (40) for time division multiplexing the stereophonically related input signals onto an output line. The operation of the switching circuit is controlled by bilevel switching control signals provided by a function generator (48). The function generator provides bilevel switching control signals which have been modified so that the output of the switching circuit inherently lacks the third harmonic component which would have been present had conventional squarewave switching control signals instead been used. A low-pass filter (56) eliminates other, higher harmonics. A switching demodulator (FIG. 9) is also disclosed. This demodulator demodulates an FM composite signal through use of the same modified switching signal as used in the modulator.

8 Claims, 10 Drawing Figures

SAMPLING FUNCTION S

SWITCHING MODULATORS AND DEMODULATORS UTILIZING MODIFIED SWITCHING SIGNAL

BACKGROUND AND FIELD OF THE INVENTION

The present invention relates to switching modulators and demodulators, and more particularly discloses switching modulators and demodulators utilizing switching signals which have been modified so that the output of the switching circuits have reduced harmonic content.

The composite stereo signals generated and transmitted by FM broadcast stations include two components; a baseband component corresponding to the sum of the two source signals (usually referred to as Left (L) and Right (R) signals), and a subcarrier component, modulated on a 38 kHz subcarrier, corresponding to the difference between the two source signals.

Switching modulators have long been used to combine the two audio source signals to produce the composite stereo signal. These switching modulators operate to alternately sample the L and R signals at the subcarrier rate of 38 kHz to produce a time division multiplexed (TDM) signal. Patents embodying this technique include Wilhelm, U.S. Pat. No. 3,040,132, Anderson et al, U.S. Pat. No. 3,789,323, and Bruene, U.S. Pat. No. 3,902,019.

Unfortunately, the signals provided by these switching modulators do not have exactly the same form as that required of the composite stereo signal which is to be transmitted. More specifically, switching modulators not only generate the required baseband and subcarrier components, but also incidentally generate a number of undesirable harmonic components. These harmonic components must be eliminated from the signal prior to transmission, or they would result in unacceptable interference with adjacent radio channels. Although low-pass filters may be used to selectively filter out these higher harmonics, such filters are both expensive and complicated. Consequently, systems have been proposed wherein the unwanted harmonic component closest in frequency to the subcarrier component (i.e., the third harmonic, or 114 kHz component) is eliminated through the addition of another signal having a component which will exactly cancel this harmonic component. Although a filter is still necessary to remove the other, higher harmonic components, the constraints on this filter are reduced since it is no longer necessary to attenuate the harmonic component immediately adjacent the subcarrier. In order to accomplish this harmonic cancellation, however, it has heretofore been necessary to include a second switching modulator in the system.

Demodulators have been implemented utilizing switching circuits in much the same manner, and with much the same problem. Thus, switching demodulators have been used to recover the L and R signals from the FM composite stereo signal, however they also recover any signal incidentally centered on an odd harmonic of a switching frequency. Low-pass filters were thus provided prior to the switching demodulator so as to eliminate any noise at these harmonic frequencies. As in the modulators, such a filter must remove the third harmonic noise component without distorting the fundamental component.

SUMMARY OF THE INVENTION

There is disclosed herein a switching modulator which operates to generate the desired FM composite stereo signal. The switching signal, however, is modified in such a manner that the output of the switching modulator inherently lacks a third harmonic component. This therefore eliminates the need for a second switching modulator to generate a signal for use in cancellation of the third harmonic component. A demodulator utilizing a modified switching signal is also disclosed.

It is therefore an object of the present invention to provide switching modulators and demodulators which may be utilized with a filter having relaxed constraints, and yet which do not require the inclusion of a second switching circuit in order to provide cancellation of a harmonic component.

It is another object of the present invention to provide switching modulators and demodulators utilizing a modified switching signal.

It is still another object of the present invention to provide switching modulators and demodulators utilizing a switching signal which has been modified in such a manner that the outputs thereof inherently lack a third harmonic component.

In accordance with the present invention, apparatus is provided for periodically gating an input signal onto an output line at a first rate to produce an output signal including a first component corresponding to the input signal modulated at the first rate but lacking a second component corresponding to the input signal modulated at a selected odd multiple of the first rate. This apparatus includes switching means for providing the output signal. The switching means is controllably switchable between first and second states in accordance with the state of a bi-level control signal. When in the first state, the switching means couples the input signal to the output line, and, when in the second state, it decouples the input signal from the output line. Means is also included for generating a bi-level control signal for controlling the switching of the switching means between the first and second states. The bi-level control signal has a periodic bi-level pattern repeated at the first rate, with the pattern being selected such that the control signal includes a harmonic component at the first rate, but essentially lacks a harmonic component at least at the selected odd multiple of the first rate. The output signal provided by the switching means therefore does not include the second component.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Although the preferred embodiment to be described hereafter will relate to third harmonic cancellation in a two-channel multiplexing arrangement, it will be appreciated that the present invention may broadly be applied to any system utilizing switching modulators or demodulators and requiring a reduction in the harmonic content in the output thereof.

Figure 1:
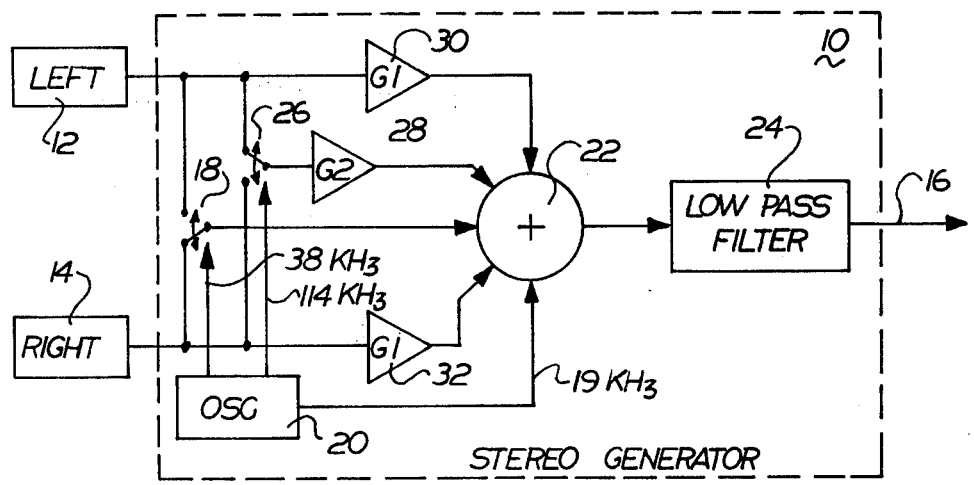
FIG. 1 is a broad block diagram of a switching modulator in accordance with the teachings of the prior art.

In FIG. 1 there is illustrated a switching modulator 10 in accordance with the teachings of the prior art. This switching modulator 10 responds to the signals provided by left and right signal sources 12 and 14 and generates therefrom an FM stereo signal which is provided along an output line 16. This modulator includes a sampling switch 18 which alternately connects the left and right signal sources 12 and 14 to one input of a signal adder 22 at a 38 kHz switching rate determined by an oscillator 20. Although switch 18 is illustrated for simplicity as a mechanical SPDT switch, solid state analog switches such as FETs are generally used for this function in practical embodiments (see, for example, FIG. 2 of Anderson et al U.S. Pat. No. 3,789,323).

The output of switch 18 includes a baseband component, a first harmonic (fundamental) component, and other, higher harmonic components situated at frequencies which are odd multiples of the switching signal. As stated previously, these higher harmonic components are undesirable by-products of the switching operation, and must be eliminated from the output. It is for this purpose that low-pass filter 24 is included. In order to relax the constraints on the low pass filter 24, the prior art stereo modulator illustrated in FIG. 1 includes a second switch 26. This switch is included to generate a signal for cancelling the third harmonic (114 kHz) component in the output of switch 18. As with switch 18, this second switch 26 also alternately connects the left and right signal sources 12 and 14 to an input to adder 22, but at a switching rate of 114 kHz, rather than 38 kHz. Again, the switching control signal is provided by the oscillator circuit 20. A gain circuit 28 adjusts the amplitude of this signal so that its 114 kHz component is equal in amplitude to the amplitude of the third harmonic component of the signal provided by switch 18. The phase of this switching is selected so that the respective 114 kHz components are opposite in phase. Consequently, when added together in signal adder 22, these 114 kHz components will cancel one another. The resulting sum signal thus lacks a third harmonic (114 kHz) component. The low pass filter 24 removes all of the higher harmonic components from the sum signal so as to provide a stereo signal at output 16 which includes only the baseband (L+R) and the first harmonic (L−R) components.

Figure 2:
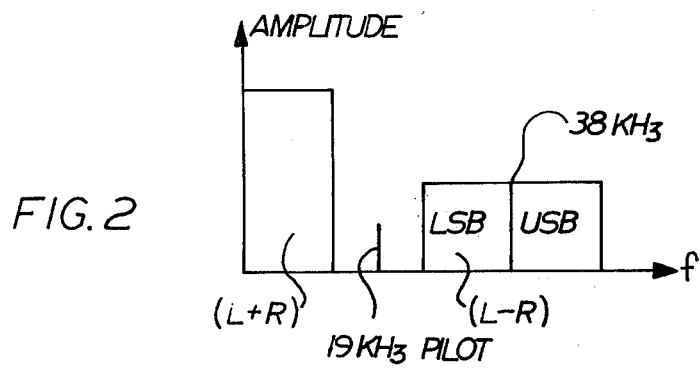
FIG. 2 is a graph of the frequency spectrum of an FM composite stereo signal.

In order to equalize the relative amplitudes of the baseband (L+R) and fundamental (L−R) components, the outputs of the left and right signal sources 12 and 14 are directly supplied to the signal adder circuit 22 through respective gain circuits 30 and 32. Signal adder 22 also adds a 19 kHz sinewave signal, usually referred to as a pilot signal, to the stereo signal. This pilot signal serves as a phase reference to assist in the demodulation of the stereo signal at a subsequent receiver. The frequency spectrum of the resulting composite stereo signal is illustrated in FIG. 2.

It will be noted that the effectiveness of the removal of the third harmonic component from the signal provided by switch 18 will depend largely upon the accuracy with which the gain factor G2 is set in the gain circuit 28. G2 must therefore be critically adjusted. In addition, this gain factor must be highly stable, since any drift of the gain factor will be reflected as an increase in the third harmonic content in the sum signal provided at the output of the adder 22.

In accordance with the teachings of the present invention, a circuit is provided which does not require the inclusion of the switch 26 or the gain factor 28, and which nevertheless accomplishes the removal of the third harmonic component from the output of the switch 18.

Figure 3:
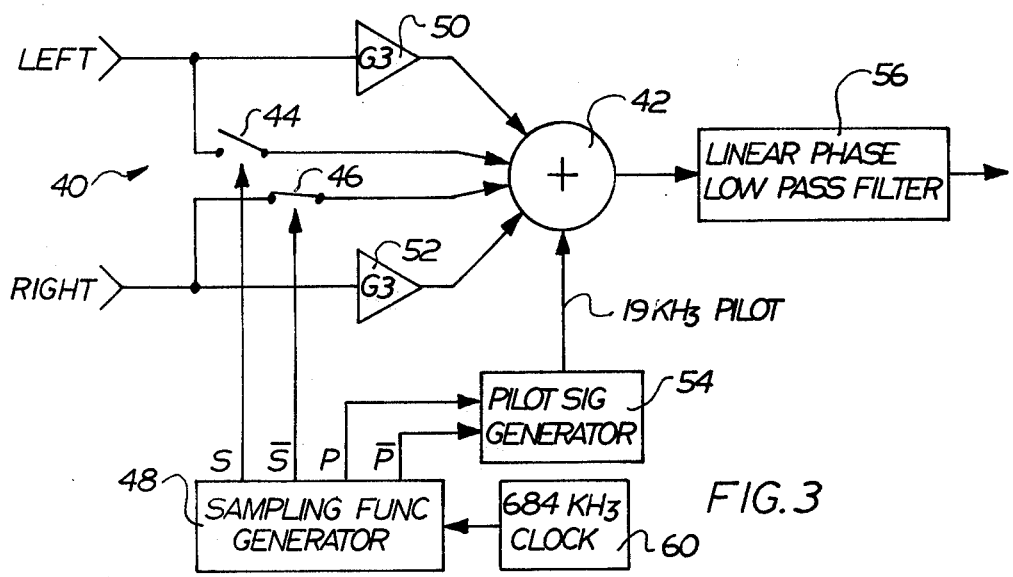
FIG. 3 is a broad block diagram of a switching modulator in accordance with the teachings of the present invention.

FIG. 3 is a broad block diagram of a switching modulator in accordance with the teachings of the present invention. As in the prior art, a switching circuit 40 is provided in order to alternately connect the left and right source signals to a signal adder 42. In FIG. 3, switching circuit 40 is characterized as two SPST switches 44 and 46, each driven by a corresponding modified sampling signal provided at an output of a sampling function generator 48. As before, electronic switches will actually be used in place of these SPST switches in a practical embodiment. The signals driving switches 44 and 46 will be the logic inverse of one another so that one, and only one of the switches will be closed at any given time. Gain circuits 50 and 52 gain provide a small portion of the left and right signals to the adder 22 in order to adjust the amplitude of the baseband portion of the stereo signal and thereby equalize the amplitudes of the baseband and fundamental portions of the output signal.

The 19 kHz pilot signal is provided to the signal adder 42 from a pilot signal generator 54. This pilot signal generator derives a 19 kHz sinewave signal from a 19 kHz squarewave signal supplied by the sampling function generator 48. Pilot signal generator 54 may, for example, have the form illustrated in the patent to Mendenhall, U.S. Pat. No. 4,112,259.

The sum of these signals is provided at the output of signal adder 42, and is then filtered by a linear-phase, low-pass filter 56 so as to again provide the composite FM stereo signal having the form shown in FIG. 2. Filter 56 will have a transition band extending from the highest frequency in the FM difference channel (38 kHz+15 kHz, or approximately 53 kHz), to the lowest frequency in the component modulated on the fifth harmonic of the switching signal (5×38 kHz−15 kHz, or approximately 175 kHz). Stated differently, linear-phase low-pass filter 56 will have an essentially flat passband from zero to approximately 53 kHz, and will reject 175 kHz and above.

Figure 4:
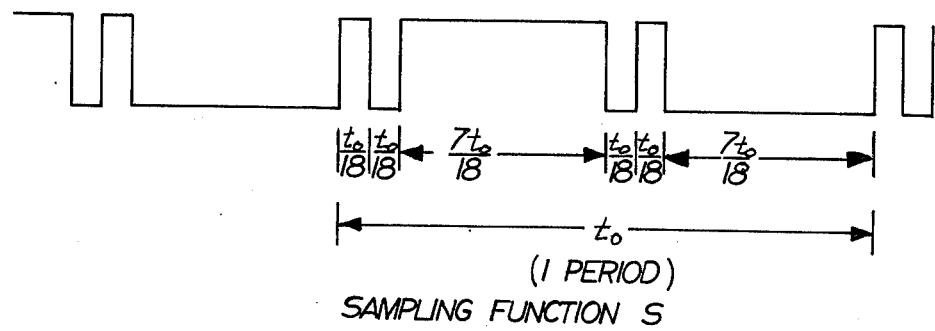
FIG. 4 is a graphical representation of the modified sampling signal utilized in the modulator of FIG. 3.

In accordance with the teachings of the present invention, the signal generated by sampling function generator 48 in order to control switches 46 and 48 will have the modified form shown in FIG. 4. As can be seen from this figure, the sampling function has been modified from the usual squarewave sampling function into a more complicated form. This modification is such that the output signal provided by the signal adder 42 will inherently lack a third harmonic component.

This sampling function is periodic and has a period $t_o$ which is the same as the period of the 38 kHz squarewave signal conventionally used in prior art switching modulators. Whereas the prior art squarewave signals included only a single positive going pulse in each period, however, the modified sampling function illustrated in FIG. 4 includes three positive going pulses in each cycle. Thus, as is shown in FIG. 4, the first pulse is 1/18 of a cycle in duration, and is separated from the second positive going pulse by an interval of 1/18 of a cycle. The second pulse is somewhat longer, being of 7/18 of a cycle in duration. The third positive going pulses is again 1/18 of a cycle in duration, and is separated from the preceding pulse by a gap of 1/18 of a cycle. Following the third pulse there is a gap of 7/18 of a cycle, after which the cycle repeats.

Figure 5:
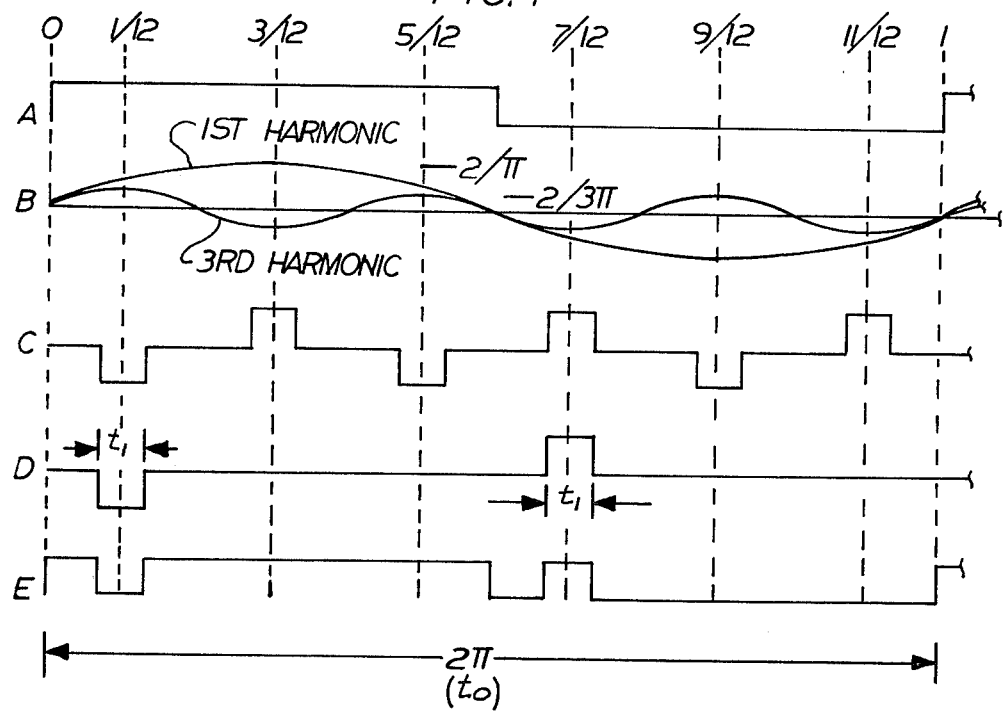
FIGS. 5A–E are graphs useful in understanding the operation of the modulator of FIG. 3.

The manner in which the sampling function has been derived, and in which it operates to generate an output lacking a third harmonic component, may be more readily understood through reference to FIG. 5. In FIG. 5A, one cycle of the conventional 38 kHz squarewave switching signal is illustrated. This squarewave signal includes a high harmonic content; the first and third harmonics are illustrated in FIG. 5B. It is the third harmonic content of the squarewave which produces the energy centered about 114 kHz in the output of conventional switching modulators. If this third harmonic component can be eliminated, the energy centered about 114 kHz in the output signal will also be eliminated.

This could be accomplished through addition of a cancellation signal having a form generally shown in FIG. 5C. It will be noted that this cancellation signal includes a negative going pulse for each positive half cycle of the third harmonic of the switching signal, and a positive going pulse for each negative half cycle of the third harmonic of the switching signal. This cancellation signal therefore includes a 114 kHz component which is opposite in phase to the third harmonic of the switching signal of FIG. 5A, and may thus be used to eliminate that third harmonic component.

Unfortunately, the addition of this cancellation signal to the squarewave of FIG. 5A will result in a multilevel signal, complicating the utilization of the signal in a practical switching modulator. The cancellation signal of FIG. 5C may, however, be modified so as to produce a signal which, when additively combined with the switching signal, will produce a sum signal having only two levels. Such a modified cancellation signal is illustrated in FIG. 5D, and is formed by deleting two out of every three pulses of the cancellation signal.

The signal illustrated in FIG. 5D, although modified, still includes a 114 kHz component which is in phase opposition with the 114 kHz component of the squarewave signal of FIG. 5A. Furthermore, the amplitude of this component may be adjusted by adjusting the duration $t_1$ of each of the pulses thereof. From Fourier analysis it can be determined that this interval $t_1$ should have a duration of 1/18 of the total period $t_o$ in order for the 114 kHz component thereof to cancel the 114 kHz component of the squarewave of FIG. 5A. The mathematical derivation of this value is set forth in the appendix, located at the conclusion of this specification. The sampling function illustrated in FIG. 4 (and again in FIG. 5E) comprises merely the additive combination of the cancellation signal of FIG. 5D, and the squarewave of FIG. 5A. This sampling function includes no third harmonic component. Therefore, when this modified signal is utilized in the modulator of FIG. 3, a modulated signal will result having essentially no 114 kHz component.

Figure 7:
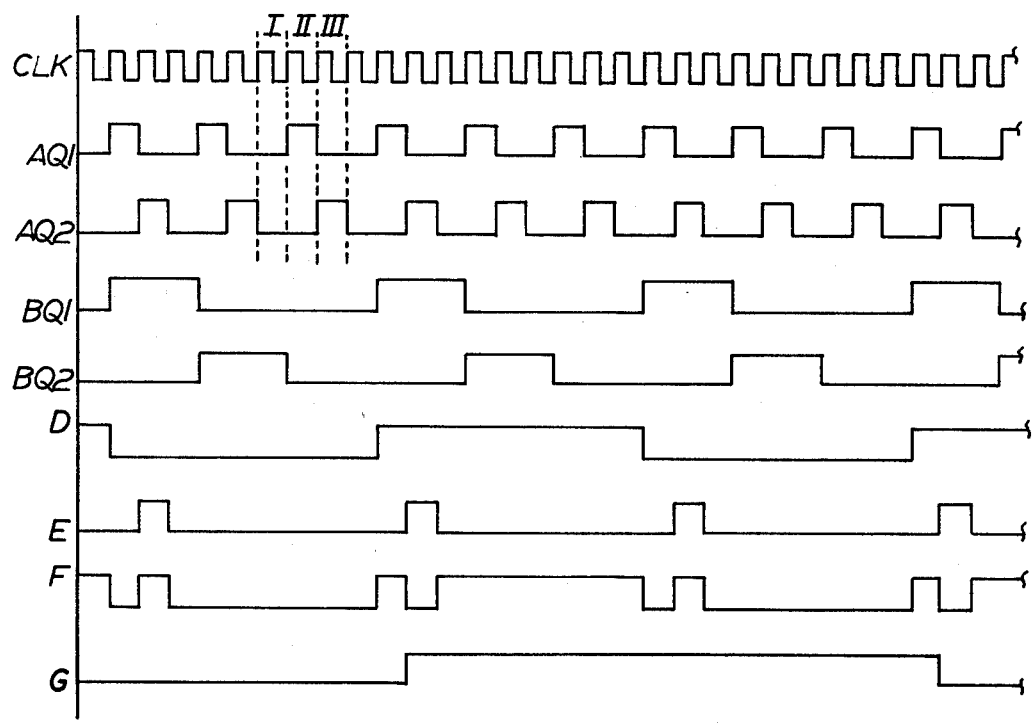
FIG. 7 is a series of timing diagrams useful in understanding the operation of the circuit of FIG. 6.
Figure 6:
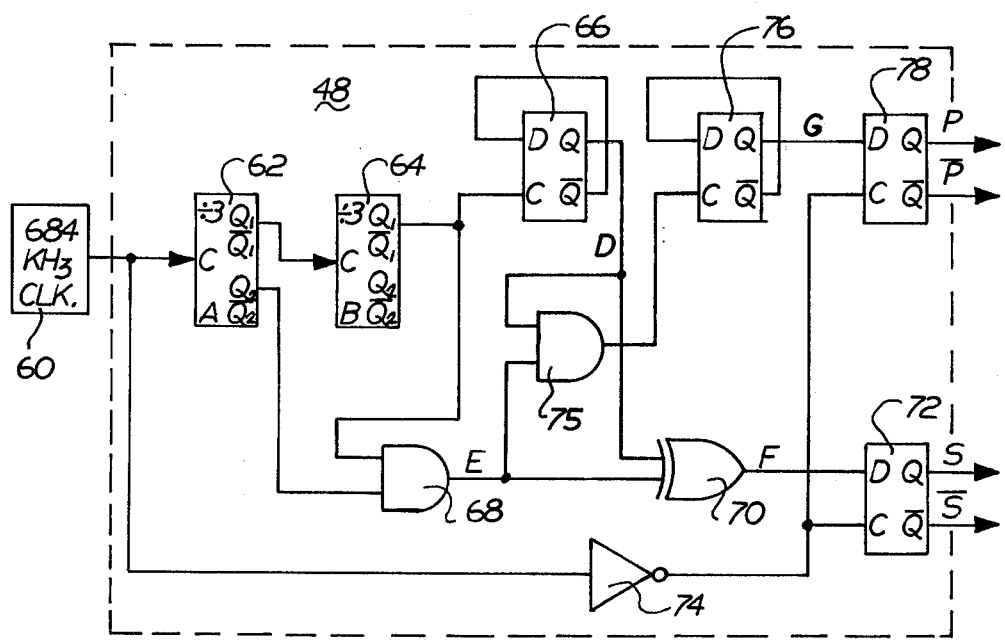
FIG. 6 is a detailed illustration of circuitry for generating the modified sampling signal utilized in the modulator of FIG. 3.

One possible embodiment of a sampling function generator 48 for generating this sampling function is illustrated in FIG. 6. The timing diagrams of FIG. 7 are provided in order to assist in an understanding of the operation of the circuitry of FIG. 6, and will not be described separately. In FIG. 6, a clock 60 provides a highly stable 684 kHz squarewave signal for clocking the operation of sampling function generator 48. This squarewave clock signal is directed to a divide-by-eighteen circuit comprised of two divide-by-three circuits 62 and 64, and a divide-by-two circuit 66. The output (D) of this divide-by-eighteen circuit comprises a squarewave signal having a frequency of 38 kHz.

The divide-by-three circuits 62 and 64 are identical and each include a clock input and two sets of outputs $Q_1$ and $Q_2$. Circuit 62 is constructed so that the $Q_1$ output thereof will be at a high logic level for one out of every three clock cycles, whereas the $Q_2$ output will be high for the clock cycle immediately succeeding that cycle in which the $Q_1$ output was high. The $Q_1$ output of divide-by-three circuit 62 will therefore provide one output pulse for each three clock pulses appearing at the clock input thereof. Divide-by-three circuit 64 is essentially identical, and thus provides one output pulse at its $Q_1$ and $Q_2$ outputs for each three pulses supplied thereto by circuit 62. The net result is that circuit 64 will provide one pulse at its output for each nine clock pulses supplied by clock circuit 60. This is further divided by two by a type "D" flip-flop 66. This flip-flop and all other type "D" flip-flops used herein are rising-edge triggered. The logic signal present on the D input thereof is thus latched into the flip-flop with each positive-going transition on the flip-flops clock input. Flip-flop 66 is connected with its inverted output fed back to the D input thereof. The Q output of the flip-flop will thus change state for each rising edge seen at its clock input. The output of flip-flop 66 will therefore comprise a squarewave signal having a total period corresponding to 18 clock pulses of clock 60. The output of flip-flop 66 thus corresponds to the 38 kHz switching signal conventionally used in switching modulators.

This 38 kHz signal (FIG. 7D) is modified by a signal (FIG. 7E) which is formed by an AND gate 68. This AND gate 68 logically "ands" the $Q_2$ output of divide-by-three circuit 62 with the $Q_1$ output of divide-by-three circuit 64. The output (FIG. 7E) of AND gate 68 corresponds generally to the modified cancellation signal shown in FIG. 5D, except that the negative going pulses thereof have been inverted so that all pulses are positive going. This signal is then combined with the output of the flip-flop 66 (FIG. 7D) in an EXCLUSIVE-OR gate 70. Gate 70 will provide a high logic level output only when the two logic signals at the inputs thereof have logic states which are different from one another. The effect of this gate will thus be to add the cancellation pulses (FIG. 7E) to the 38 kHz waveform (FIG. 7D) when that waveform is at a low logic level, and to subtract them from it when it is at a high logic level. The output F of gate 70 thus has the form illustrated in FIG. 7F, and corresponds to the sampling function shown in FIGS. 4, and 5E.

Due to propagation delays inherent in the circuits 62, 64, 66, 68 and 70, the rising and falling edges of the waveform of FIG. 7F will not be spaced apart by precise intervals defined by the cycle of clock circuit 60. In order to correct the occurrence of these rising and falling edges, the output of gate 70 is buffered with a type "D" flip-flop 72. This type "D" flip-flop is clocked with the output of clock circuit 60, as inverted through an inverter 74, so that the output thereof will reflect the input at each falling edge of the clock signal shown in FIG. 7. The output of flip-flop 72 will correspond in shape to the waveform F provided by gate 70, except that it will be delayed with respect thereto by ½ of a cycle of clock circuit 60. The transitions in this waveform are controlled, however, not by the waveform F, but rather by the clock pulses provided by clock circuit 60. These transitions will therefore be separated from one another by precise amounts, regardless of propagation delays in the remainder of the sampling function generator.

The sampling function generator 48 also provides a 19 kHz squarewave (waveform G) for use in generating the 19 kHz pilot signal. An AND gate 75 logically "ands" waveforms D and E to provide a 38 kHz pulse train at its output. The rising edges of the pulses at the output of gate 75 are essentially in phase-synchronism with the 38 kHz component of waveform F. The 19 kHz pilot signal is provided by dividing down this 38 kHz waveform at the output of gate 75 with another divide-by-two circuit 76, comprised of another type "D" flip-flop connected in the same fashion as flip-flop 66. The resulting 19 kHz signal (waveform G) is then directed through a buffer flip-flop 78, clocked in unison with buffer flip-flop 72, in order to synchronize the occurrence of the 19 kHz pilot signal with the sampling function provided at the output of flip-flop 72.

Figure 8:
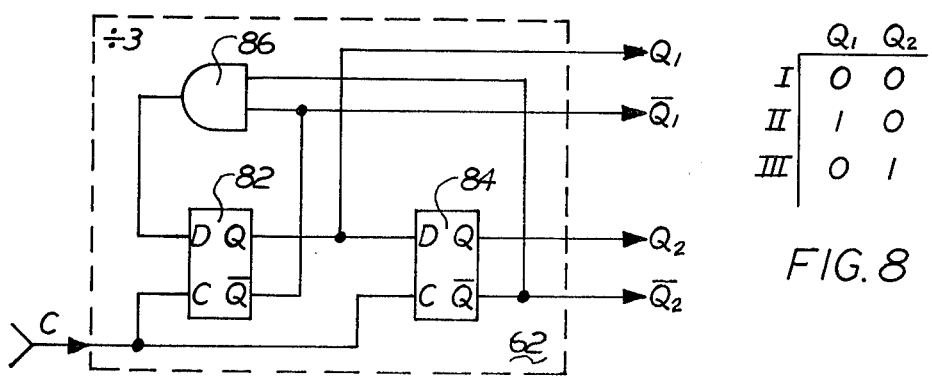
FIG. 8 is a more detailed circuit diagram of one of the blocks of the signal generator of FIG. 6.

FIG. 8 illustrates one form which divide-by-three circuits 62 and 64 could take. This circuit includes two type "D" flip-flops 82 and 84, connected together to form a two-stage shift register. Thus, the Q output of flip-flop 82 is connected to the D input of flip-flop 84, and both flip-flops are connected to the same clock input to the divide-by-three circuit. The D input to flip-flop 82 is derived from an AND gate 86. This AND gate 86 is connected to the inverted outputs of flip-flops 82 and 84 so that the output of the gate will be at a high logic level only when both the $Q_1$ and $Q_2$ outputs are at low logic levels. When this condition is met, the next rising edge presented along the clock input to the divide-by-three circuit will result in the high logic level at the output of gate 86 being latched into flip-flop 82. The output of AND gate 86 will then return to a low logic level, since the inverted output of flip-flop 82 is then at a low logic level. Consequently, with the next rising edge presented to the clock input of the divide-by-three circuit, the high logic level at the Q output of flip-flop 82 will be transferred into flip-flop 84, and the Q output of flip-flop 82 will return to a low logic level. The output of AND gate 86 will remain at a low logic level, since now the inverted output of flip-flop 84 is at a low logic level. Therefore, when the next rising edge is presented along the clock input to the divide-by-three circuit, the circuit will transfer to a third state wherein both the $Q_1$ and $Q_2$ outputs are at low logic levels. The inverted outputs of both flip-flops will then be at a high logic level, thus the output of gate 86 will again shift to a high logic level. The cycle described above will therefore be repeated continuously. The other divide-by-three circuit 64 shown in FIG. 6 has the same construction as divide-by-three circuit 62 shown in FIG. 8, and operates in a similar manner.

Figure 9:
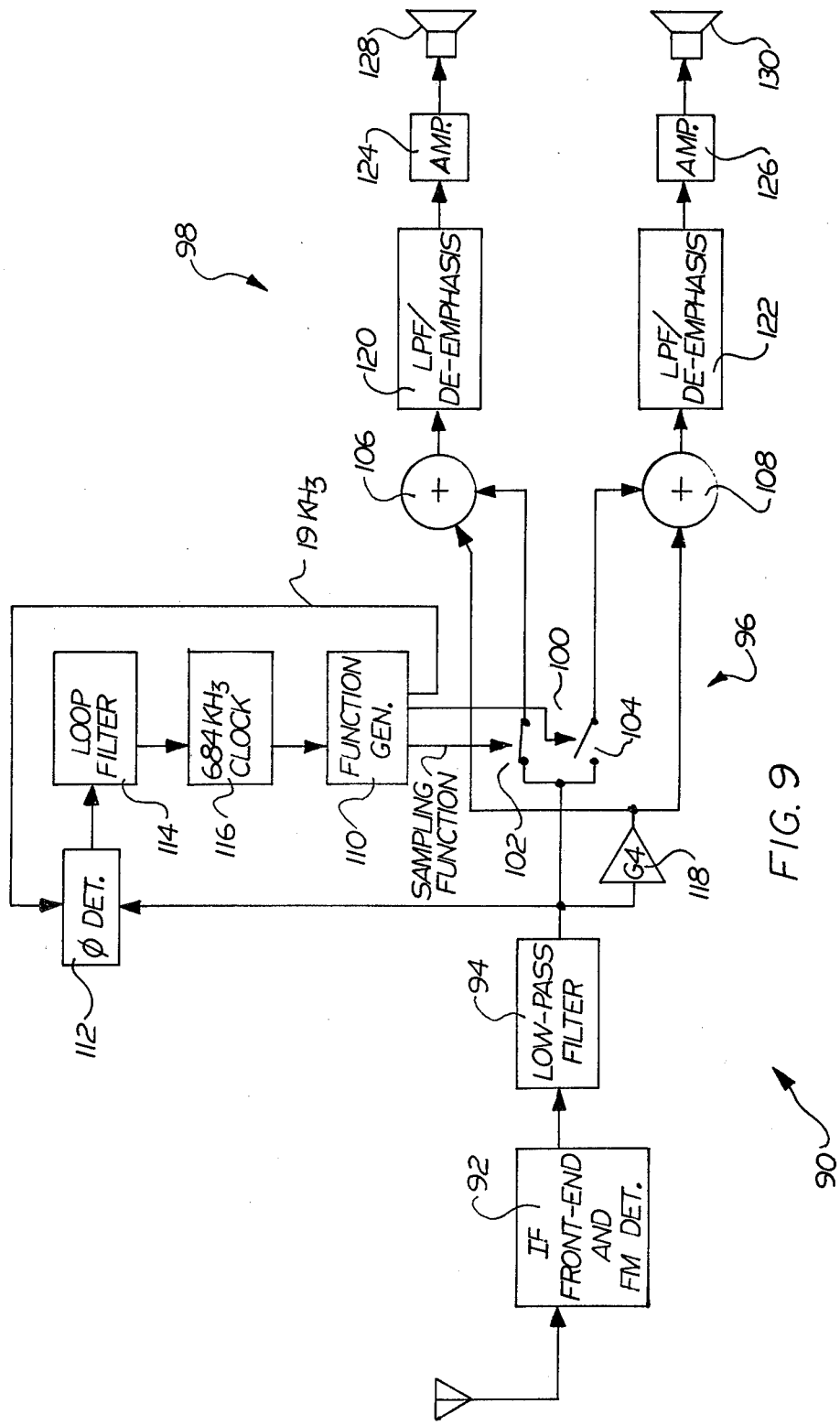
FIG. 9 is a block diagram of a stereo switching demodulator in accordance with the teachings of the present invention.

The modified sampling function which has been described will also find use in switching demodulators. One example of such a switching demodulator is illustrated in FIG. 9. In this figure, an FM stereophonic receiver 90 is illustrated including an IF front-end and FM detector stage 92, a linear-phase, low-pass filter 94, a stereophonic demodulator 96, and an output stage generally indicated at 98.

The stereophonic demodulator 96 illustrated in FIG. 9 includes a switching demodulator comprised of a switch circuit 100 driven by the sampling function described previously with respect to FIG. 4. This sampling function is generated by a function generator 110 having the same form as function generator 48 of FIGS. 3 and 6. This function generator will again be clocked by a squarewave clock signal generated by a 684 kHz clock 116.

In FIG. 9, the switching circuit 100 is characterized as two SPST switches 102 and 104, each of which connects a corresponding signal adder circuit 106 and 108 to the composite stereo signal provided at the output of low-pass filter 94. By driving these switches 102 and 104 (which, again, will be electronic switches) in synchronism with the 38 kHz subcarrier, the two stereophonically related program signals may be separately recovered. More specifically, switch 102 will provide a signal to adder 106 corresponding generally to the left program signal, whereas switch 104 will provide a signal to adder 108 corresponding generally to the right program signal.

This operation will result regardless of whether the switches 102 and 104 are driven with a conventional 38 kHz squarewave signal, or with the modified switching signal illustrated in FIG. 4. With a conventional 38 kHz switching signal, however, these switches will also necessarily demodulate any energy incidentally located at odd harmonics of the switching signal. Thus, if low-pass filter 94 were not completely effective in removing all of the energy centered on the third harmonic and higher harmonics of the switching signal, this energy would be demodulated by the switching demodulator 100, and would appear as a noise component in the output of the receiver.

In order to avoid this, the function generator 110 which provides the sampling functions for controlling the operation of switches 102 and 104 will have the same form as that illustrated in FIG. 6; the sampling function driving the switches 102 and 104 will therefore have the modified form indicated in FIG. 4. As stated previously, this sampling function does not include a third harmonic component. Consequently, switches 102 and 104 will not incidentally demodulate the energy centered on the third harmonic of the switching signal, and this energy will not represent a noise contribution in the output thereof.

Through use of this sampling function, the constraints on low-pass filter 94 may be relaxed. Thus, low-pass filter 94 need no longer completely remove all of the energy centered on the third harmonic. Consequently, filter 94 will have essentially the same characteristics as filter 56 of FIG. 3. In other words, filter 94 will have a flat pass band to 53 kHz, and will reject 175 kHz and above.

In order to insure that the sampling function is properly synchronized with the subcarrier of the stereophonic composite signal provided at the output of low-pass filter 94, a phase detector 112 is provided. This phase detector compares the phase of the 19 kHz pilot signal with the 19 kHz squarewave signal generated by function generator 110. The output of phase detector 112 is filtered by a loop filter 114 to provide a control voltage. This control voltage is directed to a frequency control input of the clock 116 which clocks the operation of function generator 110. Through the operation of this phase-locked loop, the frequency of oscillation of clock 116 will be automatically adjusted until the 19 kHz pilot signal is in phase synchronism with 19 kHz squarewave signal generated by function generator 110. Since this 19 kHz squarewave signal is generated in synchronism with the modified switching signal, this phase locking operation will also necessarily synchronize the sampling function with the subcarrier component of the stereophonic composite signal.

In addition to the respective program signal, the outputs of switching demodulator 100 will also include a low amplitude baseband signal corresponding to the sum of the left and right program signals. In order to eliminate this residual baseband component and thereby improve separation between the left and right program channels, a gain circuit 118 is provided. This gain circuit provides a signal to each of signal adders 106 and 108 which is attenuated by a gain factor of G4, and which is in phase opposition with the residual baseband signal. By adding this component to the outputs of switches 102 and 104 through these adders circuits, the left and right program signals may be demodulated with a high degree of separation therebetween. This gain circuit 118 will have essentially the same gain factor as circuits 50 and 52 of FIG. 3.

The outputs of adder circuits 106 and 108 are then provided to any desired utilization circuit, in this case illustrated as comprising low-pass filter/de-emphasis circuits 120 and 122, amplifier circuits 124 and 126, and output speakers 128 and 130.

Although the invention has been described with respect to preferred embodiments, many variations of these embodiments are possible. More specifically, it will be appreciated that the modified switching signal could take many different but equivalent forms, each lacking a third harmonic component or other undesirable harmonic component. In addition, the switching signal could be further modified to also eliminate one or more other harmonic components, in addition to the third harmonic component. It will therefore be appreciated that various rearrangements and alterations of parts may be made without departing from the spirit and scope of the invention, as defined in the appended claims.

APPENDIX

Figure 10:
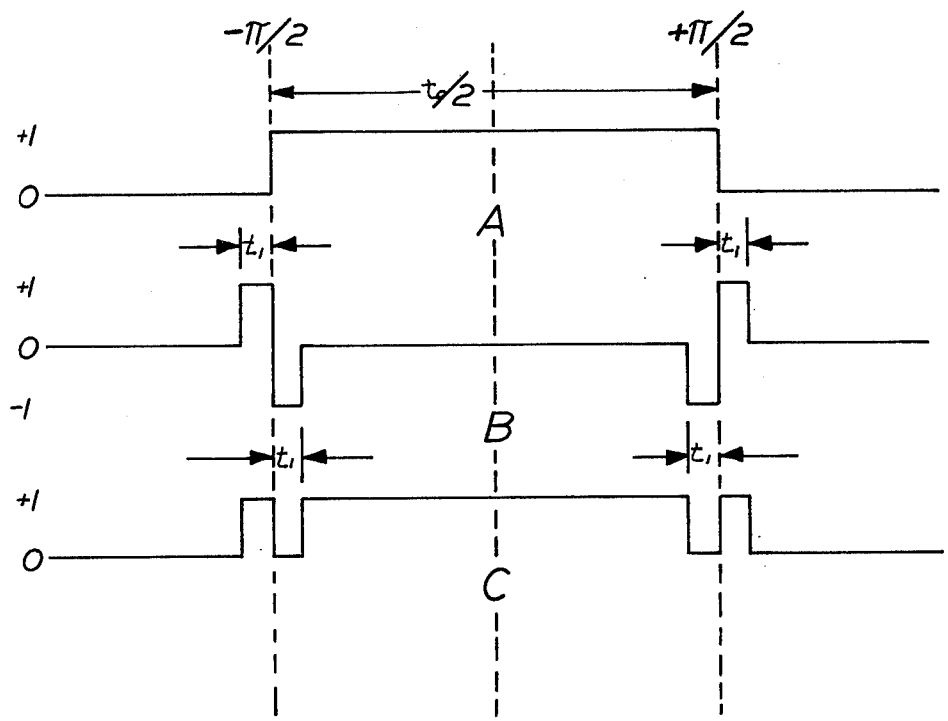
FIG. 10 is a graph useful in understanding the mathematical derivation found in the appendix.

For the purposes of the following discussion, the sampling function will be characterized as comprising the additive sum of the 38 kHz squarewave shown in FIG. 10A, and the cancellation signal shown in FIG. 10B. The resulting sum signal, shown in FIG. 10C, has the same form as the modified sampling function shown in FIGS. 4 and 5E. The purpose of this characterization is to simplify the analysis which follows by using a cancellation signal (FIG. 10B) which exhibits even symmetry with respect to the origin, as defined in FIG. 10.

The modified switching signal (FIG. 10C) will lack a 114 kHz (third harmonic) component if the 114 kHz component of the modified harmonic cancellation signal (FIG. 10B) can be made to cancel the 114 kHz component of the 38 kHz squarewave (FIG. 10A). This will occur if the respective 114 kHz components are in phase opposition with one another and are of the same amplitude.

Due to the polarity and positioning of the pulses of FIG. 10B relative to the third harmonic of the FIG. 10A squarewave, the two 114 kHz components will necessarily be in phase opposition with one another. The amplitude of the 114 kHz component of the FIG. 10B signal may be adjusted to the appropriate level by adjusting the widths $t_1$ of the pulses associated therewith. The following analysis calculates the value of $t_1$ for a cancellation signal having the form illustrated in FIG. 10B.

In order to select $t_1$, the Fourier co-efficient for the FIG. 10B signal must be determined in terms of $t_1$. The co-efficient of the 114 kHz component will then be set equal to the co-efficient of the 114 kHz component of the FIG. 10A squarewave, and the resulting equation solved for $t_1$.

The FIG. 10B cancellation signal may be defined by its Fourier series expansion:

$$f(t) = b_1 \cos(2\pi t/T) + b_2 \cos(4\pi t/T) + \ldots b_n \cos(2\pi nt/T) + \ldots \quad (1)$$

where:

$$b_n = \frac{4}{T} \int_0^{T/2} f(t) \cos(2\pi nt/T) dt \quad (2)$$

for $n = 1, 2, 3, \ldots$
and T is the period of f(t), so that $$f(t+T) = f(t) \quad (3)$$

This equation does not include either a DC term (since the DC level of the signal is zero) or sine terms (since the function has even symmetry with respect to the origin, as defined in FIG. 10). To simplify the following determinations, T will be set equal to $2\pi$. Thus:

$$b_n = (2/\pi) \int_0^{\pi} f(t) \cos nt\, dt \quad (4)$$

f(t), however, equals:

$$-1 \text{ for } [(\pi/2) - t_1]t < [\pi/2] \quad (5)$$

$$+1 \text{ for } [\pi/2]t < [(\pi/2) + t_1] \quad (6)$$

and is equal to zero at all other times in the interval from $t=0$ to $t=\pi$. Equation (4) may therefore be reduced to:

$$b_n = (2/\pi)[-\int_{\pi/2 - t_1}^{\pi/2} \cos nt\, dt + \int_{\pi/2}^{\pi/2 + t_1} \cos nt\, dt] \quad (7)$$

$$= -(2/\pi n)[\sin nt \Big|_{\pi/2 - t_1}^{\pi/2} - \sin nt \Big|_{\pi/2}^{\pi/2 + t_1}] \quad (8)$$

$$= -(2/\pi n)[\sin(n\pi/2) - \sin(n\pi/2 - nt_1) - \sin(n\pi/2 + nt_1) + \sin(n\pi/2)] \quad (9)$$

Expanding equation (9) through use of the trigonometric expansion for the cosine of a sum of two angles, and collecting like terms, we get:

$$b_n = (-4/\pi n)[\text{Sin } (\pi n/2)](1 - \text{Cos } nt_1) \quad (10)$$

This $b_n$, it will be noted, has a value of zero for all even n. Consequently, the cancellation signal will only produce odd harmonics. The amplitude of the third harmonic (n=3) will be:

$$b_3 = (-4/3\pi)[\text{Sin}(3\pi/2)](1 - \text{Cos } 3T_1) \quad (11)$$
$$= (4/3\pi)(1 - \text{Cos } 3t_1) \quad (12)$$

The amplitude of the third harmonic of the squarewave which switches between values of zero and plus one, however, is equal to $2/(3\pi)$. Setting this equal to $b_3$, we find:

$$2/3\pi = (4/3\pi)(1 - \text{Cos } 3t_1) \quad (13)$$

thus $$\text{Cos } 3t_1 = \tfrac{1}{2} \quad (14)$$
$$= \text{Cos}(\pi/3) \quad (15)$$

and $$3t_1 = \pi/3 \quad (16)$$

$$t_1 = \pi/9, \text{ or } t_0/18 \quad (17)$$

We must next determine the value which $G_3$ of attenuator 52 must have in order to equalize the amplitudes of the main channel (L+R) and the 38 kHz subchannel (L−R). By plugging the calculated value for $t_1$ into equation (10), we can determine the value $b_n$ for any n. Thus, for $t_1$ equal to $\pi/9$, we can find the value of $b_1$. The total 38 kHz coefficient, however, is equal to $b_1$ plus the contribution due to the 38 kHz squarewave (i.e., $2/\pi$). The amplitude of the total 38 kHz co-efficient, therefore, is:

$$(2/\pi) + b_1 = 0.55983 \quad (18)$$

The amplitude of the main channel (L+R), however, is entirely due to the squarewave signal, and is equal to 0.5 since the duty cycle of the 38 kHz squarewave is exactly 50%. Thus, in order to equalize the amplitudes of the (L+R) and (L−R) channels, we must increase the amplitude of the main (L+R) channel by a factor of 0.05983. This will be accomplished when the value $G_3$ of attenuator 52 is set to a value of 0.05983.

What is claimed is:

1. Apparatus for periodically gating an input signal onto an output line at a first rate to produce an output signal including a first component corresponding to said input signal modulated at said first rate but lacking a second component corresponding to said input signal modulated at a selected odd multiple of said first rate, comprising:

switching means for providing said output signal, said means being controllably switchable between first and second states in accordance with the state of a bi-level control signal for, when in said first state, coupling said input signal to said output line and, when in said second state, decoupling said input signal from said output line; and means for generating a bi-level control signal for controlling the switching of said switching means between said first and second states, said bi-level control signal having a periodic bi-level pattern repeated at said first rate, with said pattern being selected such that said bi-level control signal includes a harmonic component at said first rate, but essentially lacks a harmonic component at least at said selected odd multiple of said first rate, whereby said output signal provided by said switching means does not include said second component.

2. Apparatus as set forth in claim 1, and further comprising low-pass filter means responsive to said output signal for providing a filtered signal, said low-pass filter means being operative to substantially eliminate from said filtered signal those components of said output signal having frequencies equal to or greater than said second component without substantially affecting those components having frequencies lower than said second component, whereby the elimination of said second component permits said filter means to have a broader transition band than would otherwise have been possible.

3. Apparatus as set forth in claim 1, wherein said selected odd multiple of said first rate comprises the third multiple of said first rate, and is three times said first rate.

4. Apparatus as set forth in claim 1, wherein said output signal also includes a baseband component corresponding generally to the unmodulated input signal, and wherein said apparatus further comprises means for adding a selected portion of said input signal to said output signal so as to equalize the amplitudes of said baseband component and said first component.

5. Apparatus for multiplexing first and second input signals into a single composite signal provided at a signal output, comprising:

switching means for alternatively coupling said first or second input signals to said signal output under control of a bi-level switching control signal such that said first input signal is coupled to said output when said switching control signal is at a first level, and said second input signal is coupled to said output when said switching control signal is at a second level, and means for generating a bi-level control signal for controlling the switching of said switching means, said bi-level control signal having a periodic bi-level pattern repeated at said first rate, with said pattern being selected such that said bi-level control signal includes a harmonic component at said first rate, but essentially lacks a harmonic component at least at a selected odd multiple of said first rate, whereby said composite signal provided by said switching means does not include a component corresponding to said first and second input signals modulated at said selected odd multiple.

6. Apparatus for demultiplexing first and second signals from a single composite input signal, comprising:

switching means for alternatively coupling said single composite input signal to either a first or a second signal output under control of a bilevel switching control signal such that said composite input signal is coupled to said first signal output when said control signal is at a first level and is coupled to said second signal output when said control signal is at a second level, and means for generating a bilevel control signal for controlling the switching of said switching means, said bilevel control signal having a periodic bilevel pattern repeated at said first rate, with said pattern being selected such that said bilevel control signal includes a harmonic component at said first rate, but essentially lacks a harmonic component at least at a selected odd multiple of said first rate, whereby said first and second signals provided by said switching means do not include a component corresponding to that portion of said composite signal modulated at said selected multiple.

7. A method of gating an input signal to an output line at a first rate without incidentally producing a selected component on said output line corresponding to the input signal modulated at a given odd multiple of said first rate comprising the steps of:
  generating a bilevel switching control signal having a harmonic component whose frequency corresponds to said first rate, but not including a harmonic component whose frequency corresponds to said given odd multiple of said first rate, and
  gating said input signal to said output line in accordance with said bilevel switching control signal.

8. A method as set forth in claim 7, wherein said step of generating a switching control signal comprises the further steps of:
  providing a squarewave gating signal having a frequency corresponding to said first rate, said squarewave signal including harmonic components at odd multiples of said first rate,
  providing a harmonic cancellation signal including a harmonic component whose frequency corresponds to said given odd multiple of said first rate, and
  combining said squarewave gating signal and said harmonic cancellation signal such that said harmonic component of said harmonic cancellation signal substantially cancels the harmonic component of corresponding frequency of said squarewave gating signal, whereby said bilevel switching signal is provided including a harmonic component whose frequency corresponds to said first rate, but not a harmonic component whose frequency corresponds to said given odd multiple of said first rate.

* * * * *